Feb. 13, 1962 D. J. BRACCI 3,020,936

LEAD FORMING APPARATUS

Filed Feb. 26, 1957 4 Sheets-Sheet 1

Inventor
D. J. BRACCI
By W. A. Johnson
Attorney

Feb. 13, 1962 D. J. BRACCI 3,020,936

LEAD FORMING APPARATUS

Filed Feb. 26, 1957 4 Sheets-Sheet 2

Inventor
D. J. BRACCI
By W. A. Johnson
Attorney

Feb. 13, 1962 D. J. BRACCI 3,020,936

LEAD FORMING APPARATUS

Filed Feb. 26, 1957 4 Sheets-Sheet 3

Inventor
D. J. BRACCI
By W. A. Johnson
Attorney

Feb. 13, 1962 D. J. BRACCI 3,020,936

LEAD FORMING APPARATUS

Filed Feb. 26, 1957 4 Sheets-Sheet 4

Inventor
D.J. BRACCI
By
Attorney

United States Patent Office 3,020,936
Patented Feb. 13, 1962

3,020,936
LEAD FORMING APPARATUS
Delphio J. Bracci, Haverhill, Mass., assignor to Western Electric Company, Incorporated, New York, N.Y., a corporation of New York
Filed Feb. 26, 1957, Ser. No. 642,560
3 Claims. (Cl. 140—71)

This invention relates to lead forming apparatus particularly apparatus for forming groups of leads of electrical components for mounting on panels such as wiring boards.

Wiring boards, including panel-like structures of dielectric material having electrical circuits printed or otherwise formed on like faces of the wiring boards, result in more compact mounting of electrical components on the opposing faces of the wiring boards by forming their leads to extend through respective sets of apertures in the wiring boards and securing the ends of their leads to the respective portions of electrical circuits. In most instances, single leads extend from opposing ends of the electrical components and these leads are cut to length to cause their components to lie closely adjacent the front face of the wiring board. However, certain electrical components, such as potentiometers, must be mounted where they may be actuated readily. In such instances it is necessary to have their groups of leads extend from the back face of each component and be provided with particular bends to accurately and efficiently mount the components on the wiring boards, connect them in their respective circuits and support them in positions for actuation.

An object of the present invention is an apparatus which will efficiently and accurately form bends in groups of leads of electrical components to condition them for mounting in the wiring board.

In accordance with the object of the invention, one embodiment thereof comprises an apparatus for forming the leads of electrical components each having a group of leads with portions extending from one face of the component, disposed in co-planar relation and having offset bends formed in the remaining portions of each group of leads to produce spatial distribution of free ends of the leads and finally means is actuated to bend the co-planar portions simultaneously intermediate their ends.

Other objects and advantages will be apparent from the following detailed description when considered in conjunction with the accompanying drawings, wherein.

Figure 1:
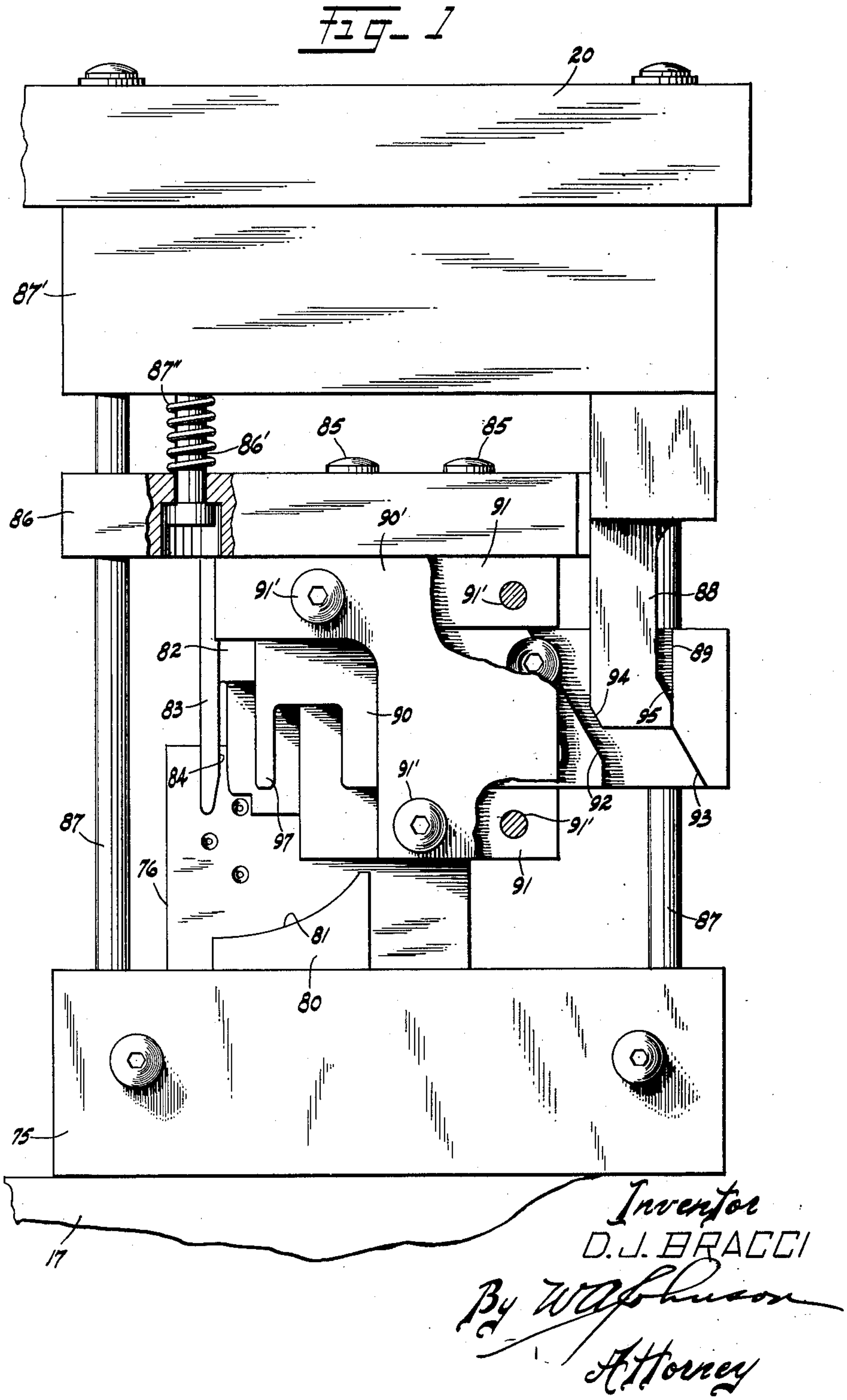
FIG. 1 is a front elevational view of another portion of the apparatus shown in open position.
Figure 2:
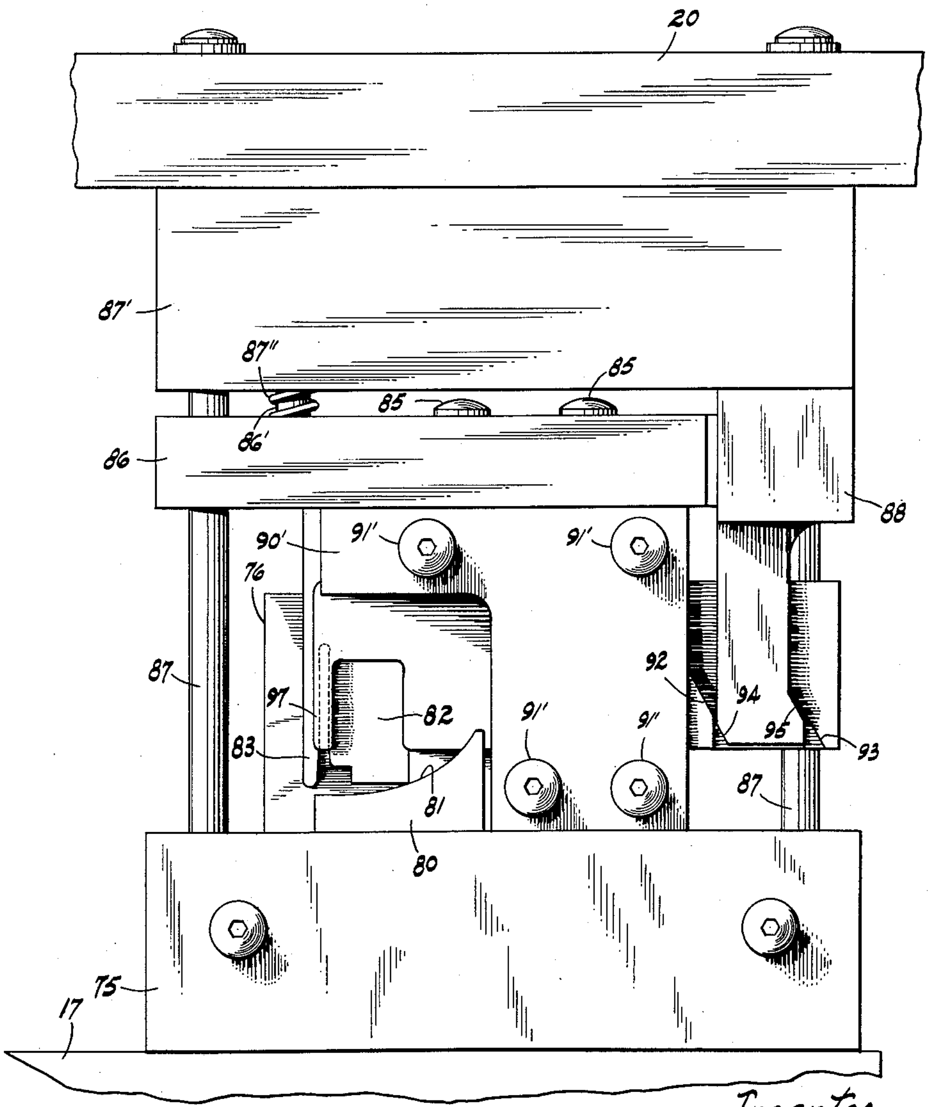
FIG. 2 is a front elevational view of the portion of the apparatus shown in FIG. 1.

The apparatus shown in FIGS. 1 to 6 inclusive includes a stationary support 75 mounted on a bed 17 and having a vertical stationary holder 76 fixed to the back of the support and provided with properly spaced apertures 77 with outwardly flared entrance ends to readily receive the bent outer ends of the leads 54 with the intermediate portions 78 of the leads abutting the surface or inner face 79 of the holder 76. An auxiliary support 80 having a curved upper surface 81 is mounted on the fixed support 75 and positioned to temporarily support the component 52 as illustrated in FIG. 10. FIG. 7 illustrates this portion of the apparatus in open position to receive the component 52 with the outer ends of the leads extending through the apertures 77 and the component resting upon the temporary support 80. A vertically movable forming element 82 has a forming member 83 with a rounded forming edge 83′ (FIG. 11) and tapered lower end surfaces disposed adjacent a vertical slot 84. An inner surface of the forming member 83 constituting one side of the slot 84 may be called a holding surface as it holds the leads against bending except at the rounded forming edge 83′. Also a side surface of the forming member 83 opposite the forming edge 83′ is parallel with, and spaced from, the surface 79 of the holder 76 and cooperates with a surface of a cutaway portion of the forming element 82 lying in the same plane therewith and cooperating with the surface 79 to hold the intermediate lateral portions of the leads against bending. The vertical slot 84 is positioned to receive the co-planar portions of the leads between the bends and the component, and is widened at its mouth as illustrated in FIGS. 7 and 10. The vertically movable forming element 82 is fixed at 85 to a lateral member 86 slidable on vertical rods 87 extending upwardly from the fixed support 75. A plurality of screws 86′ threaded into a holder 87′ support the member 86 which is cushioned by springs 87″. The holder 87 is mounted upon the undersurface of the movable support 20. A cam 88 is also mounted on the holder 87 and is receivable in a groove 89 of a laterally moving second forming element 90. The element 90 is supported for sliding movement between the forming element 82 at the back, a plate 90′ at the front and guide blocks 91 top and bottom, the plate and blocks being secured to the element 82 by screws 91′. Diagonal surfaces 92 and 93 of the groove 89 cooperate with diagonal surfaces 94 and 95 respectively of the cam 88 to bring about actuation of the forming element 98, during movement of the cam through each operating cycle. The forward face 97 of the element 90 lies back of the co-planar portions of the leads between the bends and the component and is forced against the leads after they are positioned in the slot 84 of the vertically movable forming element 82 to form like right angle bends in these portions of the leads.

A cutting element 100 is positioned for sliding movement vertically and horizontally on the back face 101 of the support 76 and has offset portions with diagonal surfaces providing cutting edges 102 for the respective leads 54 to cut the excess portions from the leads through cooperation of the holder 76. The cutter 100 is supported by the laterally moving forming element 90 through the aid of suitable supporting pins 104 which extend through laterally elongated apertures in the forming element 82. The cutter is actuated with the forming element through the function of the cam 88.

Figure 3:
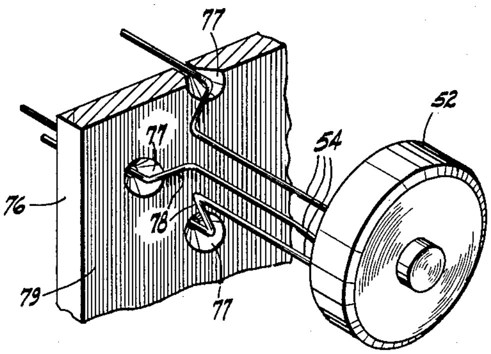
FIG. 3 is a fragmentary isometric view of a portion of the apparatus with parts removed to illustrate location of the forms of leads of the electrical component.
Figure 4:
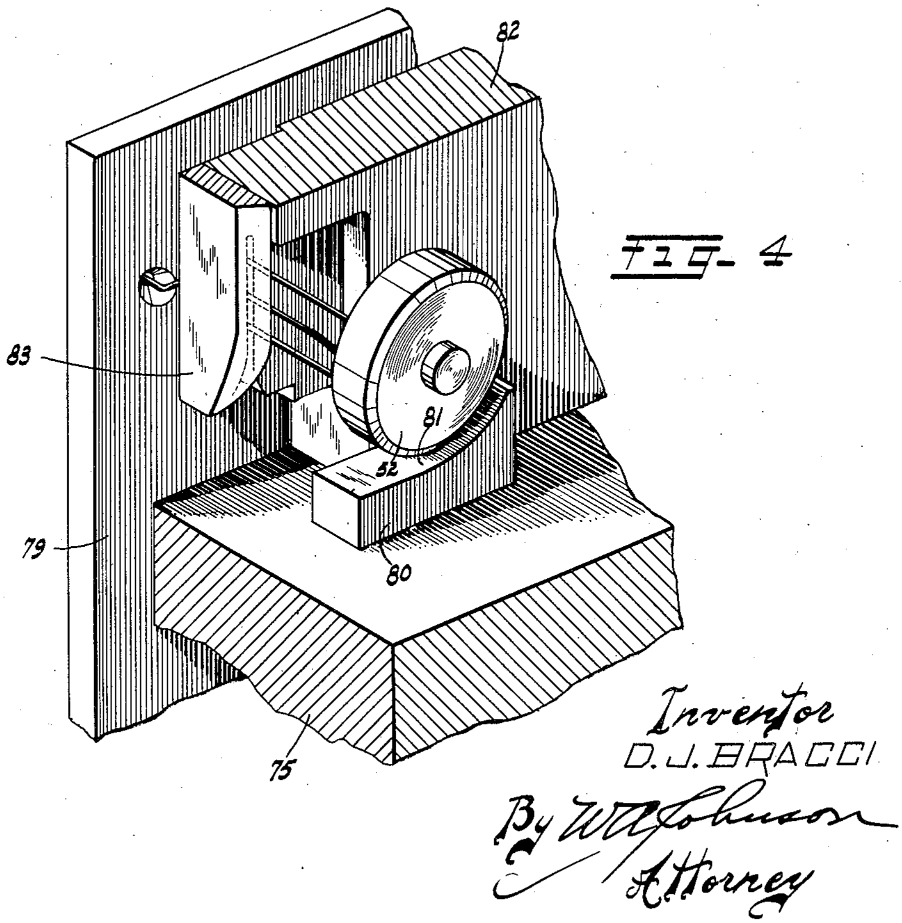
FIG. 4 is a fragmentary isometric view of a portion of the apparatus shown in FIGS. 1 and 2 during operation thereof.
Figure 5:
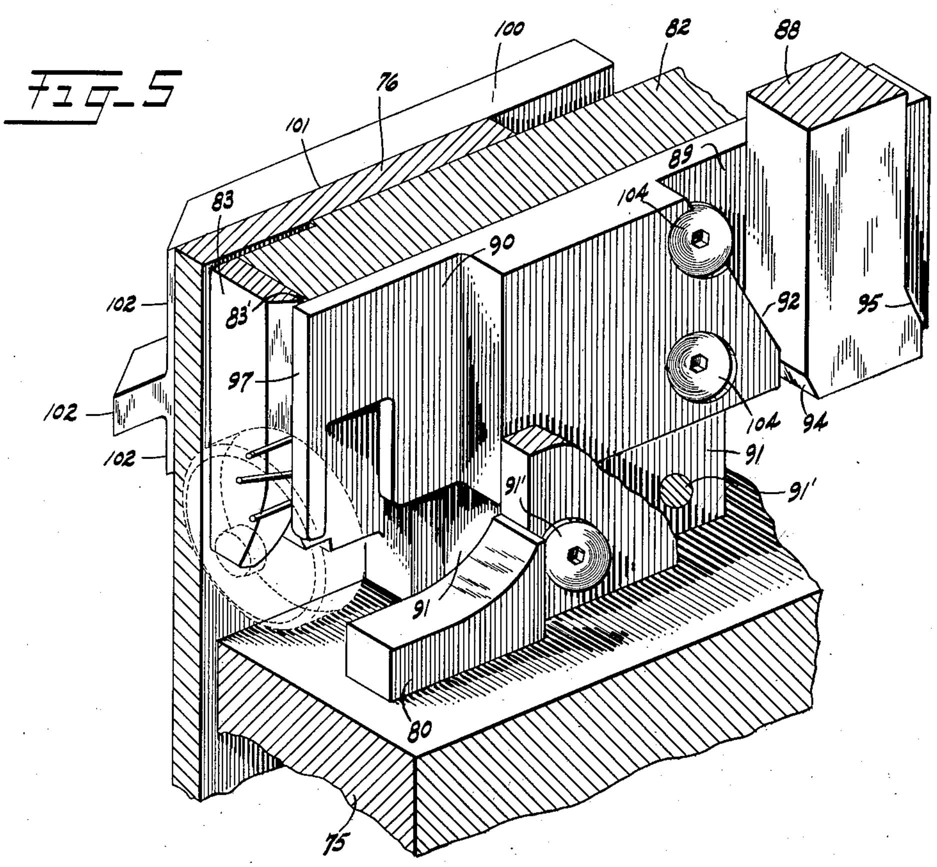
FIG. 5 is a fragmentary isometric view of the apparatus shown in FIGS. 1 and 2 at the bottom of the operating cycle.
Figure 6:
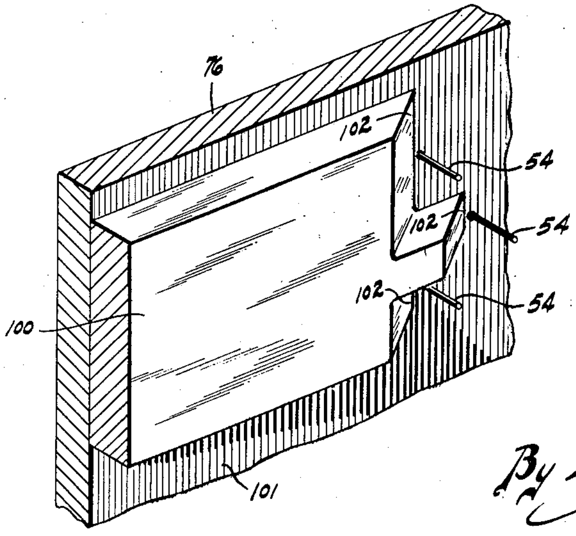
FIG. 6 is a fragmentary isometric view of the cutter in position to cut the leads when moved into the position shown in FIG. 5.

The component is placed in the apparatus as shown in FIGS. 3 and 4 with the ends of the leads extending through the apertures 77 as far as permitted by the lateral intermediate portions 78, allowing the component to rest upon the support 80. The ends of the leads are received and held in the apertures 77 during actuation of the vertically movable forming element 82 and the laterally movable forming element 90, respectively, with the simultaneous movement of the cutter 100 to produce like right-angle bends in the co-planar portions of the leads adjacent the components. The action of the apparatus, particularly the arrangement of the cam 88 and the surfaces of the groove 89 permit downward movement of the forming element 82 to position the co-planar portions of the leads in the slot 84 prior to actuation of the forming element 90 and the cutter 100 so that the bends may be formed in the co-planar portions of the leads simultaneously with the cutting of the excess lengths from the leads during the cooperation of the cutter and the holder 76.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. In an apparatus for forming the leads of electrical components each having a group of leads with co-planer portions extending given distances from ends of the leads fixed to a face of the component and offset bends in the remaining lengths of the leads to provide lateral intermediate portions lying in a given plane and free end portions disposed at predetermined spaced positions, a stationary holder having a surface against which the lateral portions rest and apertures disposed at predetermined spaced positions to receive the free end portions in their respective positions, hold them against bending and position the co-planar portions in a given plane to be bent, a first forming element supported for movement in a plane parallel with the surface of the holder between a normal position away from the apertures and a forming position adjacent the apertures, a forming member fixed to the first forming element, cooperating therewith to form a slot disposed in the plane of the co-planar portions and having a forming surface disposed parallel with the slot, means to move the first forming element into its forming position where the co-planar portions of the leads will be in the slot and the forming surface will be disposed at one side of the co-planar portions, a second forming element having a forming surface disposed on the other side of the co-planar portions and positioned with respect to the forming surface of the forming member to cooperate therewith, when moved through a forming cycle, to bend the co-planar portions of the leads at the juncture of the forming surfaces and move the component with the fixed ends of the leads relative to the held free end portions of the leads, and means actuable to move the second forming element to move the forming surface thereof through a forming cycle between a normal position short of the slot of the first forming element and an operated position beyond the slot thereof.

2. An apparatus for forming leads according to claim 1 in which surfaces of the first forming element and the forming member disposed in a given plane lie parallel with the surface of the holder and are positioned to cooperate with said surface to hold the lateral intermediate portions of the leads against bending.

3. An apparatus for forming leads according to claim 1 in which the holder is of a thickness equaling a desired length for the free end portions of the leads, a cutter having cutting edge portions cooperating with their respective apertures of the holder to cut excess lengths of the leads from the free end portions thereof, and means operatively connecting the cutter to the second forming element for movement thereby on a back surface of the holder relative to the apertures.

References Cited in the file of this patent

UNITED STATES PATENTS

| | | |
|---|---|---|
| 1,448,567 | Muller et al. | Mar. 13, 1923 |
| 1,562,973 | Kuester | Nov. 24, 1925 |
| 1,645,865 | Kondakjian | Oct. 18, 1927 |
| 1,811,457 | De Puy et al. | June 23, 1931 |
| 1,828,884 | Verpent | Oct. 27, 1931 |
| 2,372,082 | Iden | Mar. 20, 1945 |
| 2,387,074 | Hroch | Oct. 16, 1945 |
| 2,473,919 | Stone | June 21, 1949 |
| 2,653,631 | Vaughan | Sept. 29, 1953 |
| 2,779,993 | Pityo | Feb. 5, 1957 |